United States Patent [19]

Shur

[11] Patent Number: 5,012,315
[45] Date of Patent: Apr. 30, 1991

[54] SPLIT-GATE FIELD EFFECT TRANSISTOR

[75] Inventor: Michael Shur, Golden Valley, Minn.

[73] Assignee: Regents of University of Minnesota, St. Paul, Minn.

[21] Appl. No.: 295,083

[22] Filed: Jan. 9, 1989

[51] Int. Cl.⁵ ..................... H01L 29/78; H01L 29/86
[52] U.S. Cl. ............................ 357/23.14; 357/23.12; 357/91
[58] Field of Search ................. 357/23.12, 23.14, 16, 357/91

[56] References Cited

U.S. PATENT DOCUMENTS

| 3,333,168 | 7/1967 | Hofstein | 357/23.14 |
| 3,436,623 | 4/1969 | Beer | 357/23.14 |
| 3,714,522 | 1/1973 | Komiya | 357/23.14 |
| 4,395,725 | 7/1983 | Parekh | 357/23.12 |
| 4,814,839 | 3/1989 | Nishizawa | 357/23.12 |

FOREIGN PATENT DOCUMENTS 59-200465  11/1984  Japan .

OTHER PUBLICATIONS

Ballistic Transport in Hot-Electron Transistors, written by Jingming Xu and Michael Shur and published in the Journal of Applied Physics 62 (9), Nov. 1, 1987, pp. 3816 through 3820.

Primary Examiner—Mark Prenty
Attorney, Agent, or Firm—Kinney & Lange

[57] ABSTRACT

A field effect transistor having a gate voltage swing in the transistor channel varying as a function of position between the drain and the source. The gate voltage swing in the transistor channel may be made to vary as a function of position by making the threshold voltage a function of position. Alternatively, a split-gate device may be used by applying a voltage between the gates. In both cases, the electric field near the source is raised to accelerate the electrons thereby decreasing electron transit time.

3 Claims, 3 Drawing Sheets

SPLIT-GATE FIELD EFFECT TRANSISTOR

BACKGROUND OF THE INVENTION

1. Field of the Invention

The present invention relates to semiconductor devices. In particular, the invention relates to a method of increasing speed and operating frequency of field-effect transistors by increasing the average carrier velocity in field effect transistors.

2. Description of the Prior Art

The switching speed of field effect transistors is limited by the carrier velocity. In very short semiconductor devices electrons are expected to move ballistically, i.e. without any collisions with phonons or impurities. This may boost carrier velocity far beyond the carrier velocities in longer devices. Effective electron velocities as high as $3.25 \times 10^7$ cm/s in a channel of a 0.08 micrometer gate-length planar-doped pseudomorphic AlGaAs/InGaAs/GaAs quantum-well High Electron Mobility Transistor (H/EMT) have been observed. This value is substantially higher than typical electron velocities in high-speed GaAs field-effect transistors ($1-2 \times 10^7$ cm/s) and somewhat larger than the peak velocity in InGaAs (approximately $2.8 \times 10^7$ cm/s).

Nevertheless, the advantages of ballistic and/or overshoot transport are diminished in short-channel field-effect transistors compared to vertical device structures, such as a Hot Electron Transistor or a Planar-Doped Transistor. In these vertical device structures, electrons enter the active region with considerable initial velocities. Consequently, the overall transient time is decreased thus improving the probability of ballistic transport of the electrons.

In a field effect transistor (i.e. a lateral device), on the other hand, electrons initially enter the channel with a low velocity. The electrons are gradually accelerated toward the drain due to the electric field in the field effect transistor. As numerical simulations of high-speed field effect transistors clearly indicate, the maximum electron drift velocity is reached near the drain (See, for example, A. Cappy et. al., "Comparative Potential Performance of Si, GaAs, GaInAs, InAs Submicro-meter-gate FETs", IEEE Trans. Electron Devices, Vol. ED-27, p. 2158 (1980)). The electrons move very fast in the region near the drain but relatively slow in the region near the source due to the low initial velocity of the electrons as they enter the channel. The electrons are thus more likely to experience collisions limiting their acceleration in the region near the source. The device speed is determined by the overall transit time under the gate. The device speed is heavily affected by the relatively slow electron drift velocity in the channel near the source region.

Despite a high level of interest in high speed semiconductor devices, and considerable theoretical and experimental efforts directed to the use of ballistic transport of electrons in field effect transistors and other means of increasing transistor speed, development of a high speed GaAs field effect transistor with electron velocities approaching that of vertically structured devices has yet to be achieved.

SUMMARY OF THE INVENTION

The present invention is based upon the discovery that the performance of a field effect transistor can be greatly improved if the electric field, electric potential and carrier distributions along the transistor's channel are changed in such a way that electrons are accelerated more rapidly thereby raising the average electron velocity in the channel. This may be achieved, for example, by making the device threshold voltage a function of position along the transistor channel. By choosing a more positive threshold voltage near the source of the field effect transistor for n-channel devices (and a more negative threshold voltage for p-channel devices), we make the channel more resistive near the source, thus increasing the electric field in that region. This will lead to a more rapid acceleration of electrons near the source.

An alternative approach is to use a device with the same threshold voltage along the length of the channel but with a "split" gate. By applying a more positive gate voltage to the gate that is closer to the drain, the electric field distribution across the channel is changed in such a way that the electric field under the gate that is closer to the source becomes larger. This also causes a more rapid acceleration of electrons near the source. This differs from a conventional dual-gate field effect transistor in which the FET behaves as two field effect transistors in series. In the split-gate device, the gates are very close, so that the electric field in the channel is continuous. In practical terms, this means that the separation between the two gates should be smaller than or on the order of the effective distance between the gate and the channel, $d_{eff}$. Thus, if the same gate voltage is applied to both gates, the split-gate device behaves in the same way as a single-gate device.

DETAILED DESCRIPTION OF THE PREFERRED EMBODIMENTS

Figure 1:
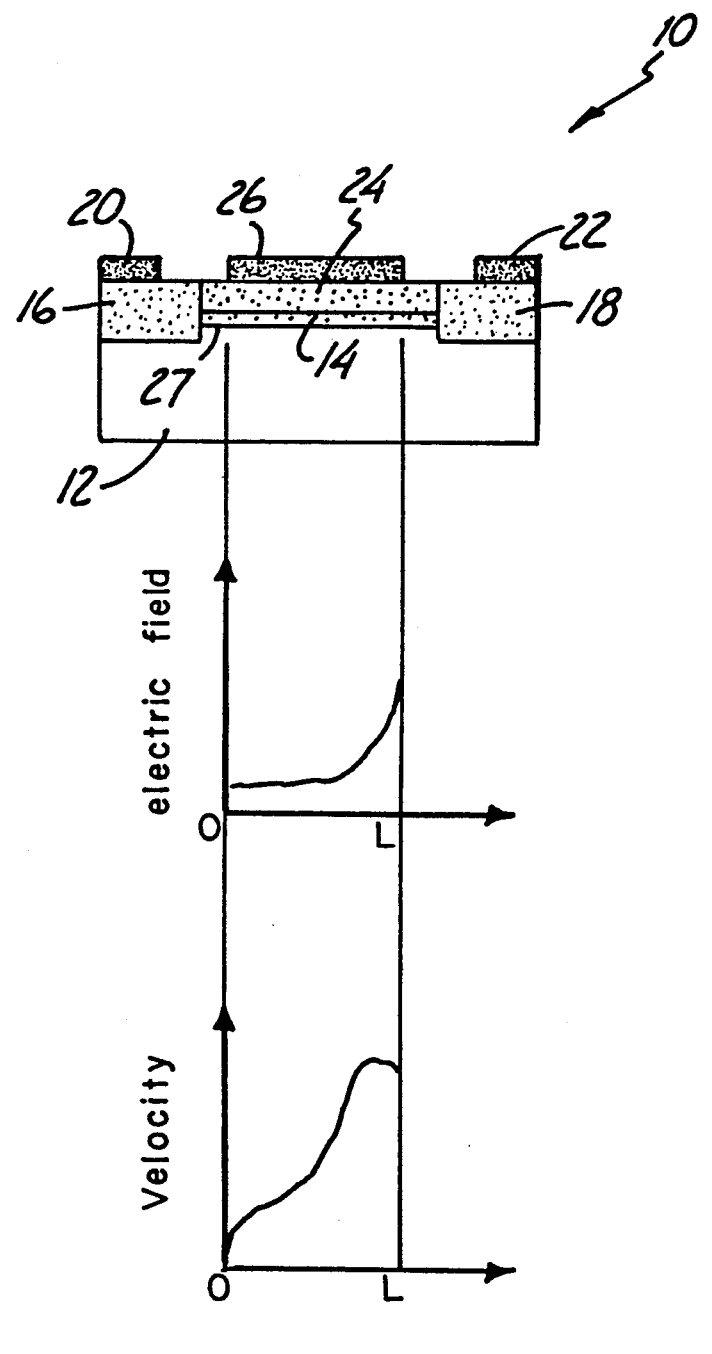
FIG. 1 is a schematic diagram of a conventional planar-doped field effect transistor with a constant threshold voltage. Graphical representations of electric field and carrier velocity along the channel are shown.

In order to appreciate the improvement which is provided by the present invention, it is first necessary to have an understanding of electron transport in the channel of a field effect transistor. Referring to FIG. 1, a conventional field effect transistor 10 is shown schematically. Field effect transistor 10 comprises a GaAs substrate 12, a doped-plane 14, a source 16, a drain 18, a source contact 20, a drain contact 22, an AlGaAs layer 24 and a gate contact 26 of length L. A channel 27 extends between source 16 and drain 18. FIG. 1 also includes graphical representations of the electric field and the electron velocity in transistor 10 along channel 27.

The threshold voltage in field effect transistor 10 is generally constant along channel 27. Electrons enter channel 27 of field effect transistor 10 from the source 16 and exit channel 24 to drain 18. The electric field along the channel is shown graphically in FIG. 1 in the graph of the electric field versus distance (x). It can be seen that near source 16 of field effect transistor 10, the electric field is at its minimum value and increases exponentially to its maximum value at the edge of channel 27 near drain 18. The characteristic of this electric field causes the electrons in channel 27 to undergo relatively little acceleration in the area near source 16 of field effect transistor 10 and a substantial amount of acceleration as the electrons near drain 18. Thus, the average velocity of the electrons through channel 27 is severely limited by their relatively low velocity near source 16.

Figure 2:
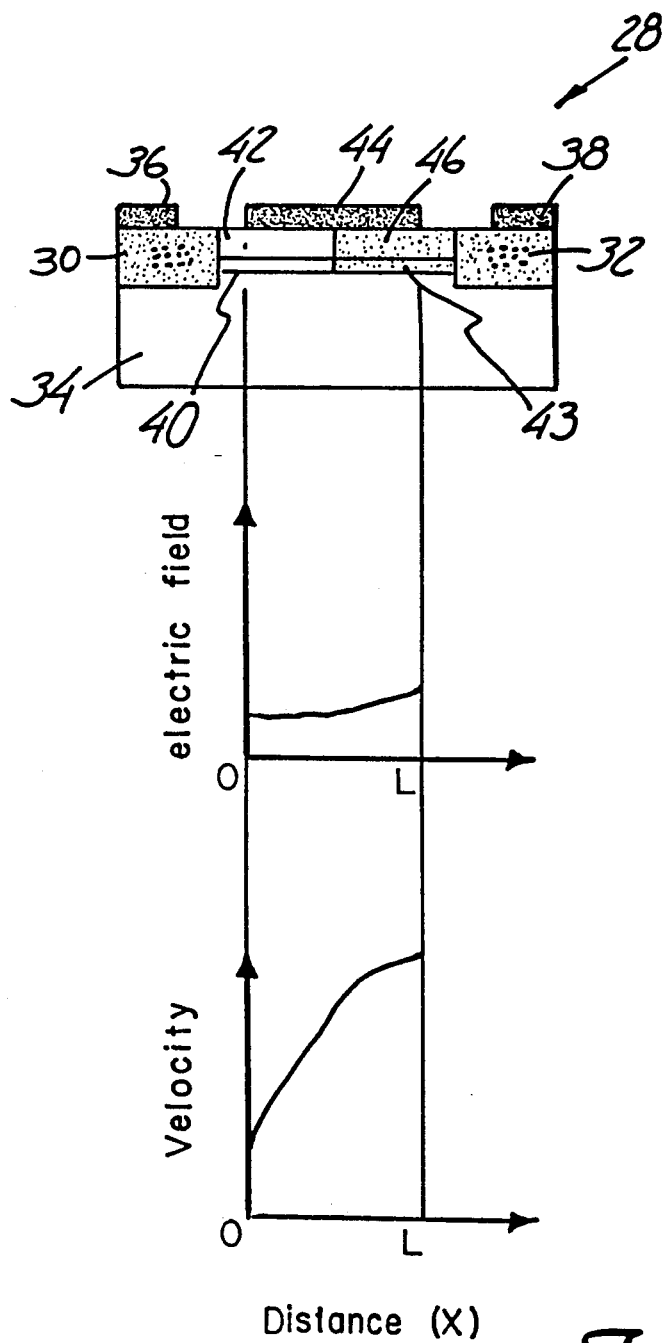
FIG. 2 is a schematic diagram of a planar-doped field effect transistor with lateral variation of the threshold voltage. Graphical representations of the electric field and carrier velocity along the channel are shown.

Referring now to FIG. 2, a field effect transistor 28 having a threshold voltage as a function of position is shown. Field effect transistor 28 includes a source 30, a drain 32, a GaAs substrate 34, a source contact 36, a drain contact 38, a channel 40, an AlGaAs layer 42, a doped plane 43, and gate contact 44. Field effect transistor 28 also includes ion-implanted region 46. The threshold voltage of field effect transistor 28 shown in FIG. 2 is a function of position along channel 40 due to ion-implanted region 46. By choosing a more positve threshold voltage in channel 40 near source 30 the region of channel 40 near source 30 becomes more resistive, thus increasing the electric field near source 30. This is graphically shown in FIG. 2 in the graph of electric field versus distance (x). Comparing the graph of electric field versus distance in FIG. 2 with that of FIG. 1, the electric field in channel 40 near source 30 is increased and the overall electric field is more nearly constant throughout channel 40 then in channel 27 of transistor 10.

The increased electric field near source 30 of field effect transistor 28 shown in FIG. 2 leads to a more rapid acceleration of electrons near source 30. This is shown in the graph of velocity versus distance in FIG. 2. Compared to FIG. 1, the electrons in channel 40 experience much greater acceleration near source 30 of field effect transistor 28 in FIG. 2 over similarly positioned electrons in the conventional field effect transistor 10 of FIG. 1. This results in a decrease in the transit time of electrons through channel 40 of field effect transistor 28. Transit time equals the channel length divided by the average velocity $(t=L/v_{avg})$. The average velocity through the channel is equal to the area under the curves shown in the graph of velocity versus distance in FIGS. 1 and 2. The average velocity may be calculated using the formula $$v_{avg} = \int_o^L \frac{vdx}{L} \quad \text{Equation 1}$$

Where L is the length of channels 27 and 40. Thus the average velocity through channel 40 is substantially increased over that of channel 27 due to the increased area under graph of velocity in FIG. 2.

Figure 3:
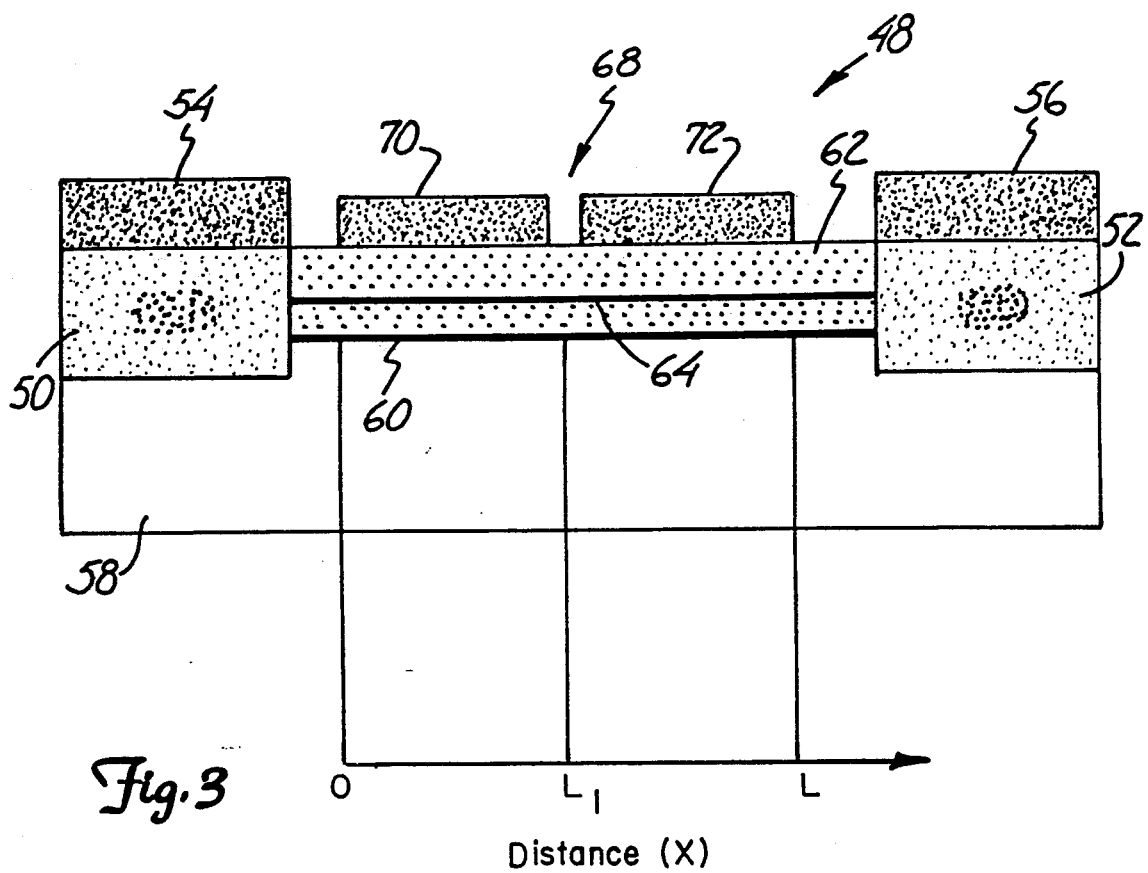
FIG. 3 is a schematic diagram of a planar-doped split-gate field effect transistor.

Referring now to FIG. 3, a split-gate field effect transistor 48 is shown. Split-gate field effect transistor 48 includes a source 50, a drain 52, a source contact 54, a drain contact 56, GaAs substrate 58, a channel 60, an AlGaAs layer 62, and a doped plane 64. Split-gate field effect transistor 48 also includes a split-gate structure 68 comprising gate contacts 70 and 72. Gate contact 70 extends generally between a left most position closest to source 50 (0) to $L_1$ in the x direction shown in FIG. 3. Gate contact 72 extends generally between $L_1$ and L.

The split-gate field effect transistor 48 shown in FIG. 3 is an alternative approach to the varying threshold voltage of the field effect transistor 28 shown in FIG. 2.

By applying a more positive gate voltage to gate 72 (the gate closer to drain 52) the electric field distribution across channel 60 is changed in such a way that the electric field under gate 70 (the gate closer to source 50) becomes larger. This increased electric field near source 50 causes a more rapid acceleration of electrons near source 50. The qualitive field and velocity distributions in channel 60 of split-gate field effect transistor 48 are similar to those shown graphically in FIG. 2 for field effect transistor 28 having a varying threshold voltage.

The split-gate field effect transistor 48 functions differently than a conventional dual-gate field effect transistor. In a dual-gate device, the gates are separated by a relatively large distance, so that a dual-gate field effect transistor behaves as two field effect transistors in series. In the split-gate field effect transistor 48 of FIG. 3, on the other hand, the gates are very close so that the electric field in the channel is continuous. If the same gate voltage is applied to both gates 70 and 72, the split-gate field effect transistor 48 behaves in the same way as a conventional field effect transistor, for example 10 in FIG. 1. This means that the separation between gates 70 and 72 in split-gate field effect transistor 48 should be smaller than or on the order of the effective distance between gate 70 or 72 and channel 60 ($d_{eff}$).

By calculating the High Electron Mobility Transistor (HEMT) transconductance using a simple charge control model (M. Shur, GaAs Devices and Circuits, Plenum, New York (1987), for example), the advantages of a split-gate device may be illustrated. Assuming that the electron velocity in channel 60 is given by the formula:

$$v = \begin{cases} uF & F < F_s = v_s/\mu \\ v_s & F \geq F_s = v_s/\mu \end{cases} \quad \text{Equation 2}$$

Where F is the electric field, $\mu$ is the effective field effect mobility and $v_s$ is the effective electron saturation velocity. When the electric field in channel 60 is smaller than the electric saturation field, $F_s$, the electric current in the channel is given by:

$$i = qn_s\mu FW \quad \text{Equation 3}$$

Where q is the electronic charge, W is the gate width, and F is the electric field given by:

$$|F| = dV/dx \quad \text{Equation 4}$$

V is the channel potential, x is the coordinate along the channel, and $n_s$ is the surface carrier concentration in the channel given by:

$$n_s = \begin{cases} (c_{eff}/q)(V_{g1} - V_{t1} - V) & \text{for } 0 \leq x \leq L_1 \\ (c_{eff}/q)(V_{g1} - V_{t2} - V) & \text{for } L \leq x \leq L_1 \end{cases} \quad \text{Equation 5}$$

Where $V_{g1}$ and $V_{g2}$ are gate voltages applied to first gate 70 and second gate 72 of split-gate field effect transistor 48 in FIG. 3, $V_{t1}$ and $V_{t2}$ are the threshold voltages under the first and second gate 70 and 72, respectively, $c_{eff}$ is the effective gate capacitance per unit area given by:

$$c_{eff} = \epsilon/d_{eff} = \epsilon/(d + \Delta d) \quad \text{Equation 6}$$

Where d is the distance between the gate and the channel 60, $\Delta d$ is the effective thickness of the two dimensional electron gas, $\epsilon$ is the dielectric permittivity of the semiconductor layer between the gate and channel 60.

Substituting equations 4 and 5 into equation 3 and integrating with respect to x, equations are obtained yielding the electric potential distribution in the channel V(x). The saturation current is determined from the condition that the maximum field in channel 60 is equal to $F_s$. Depending on the gate voltage swing and on the difference, $\Delta V_g$, between the gate voltages applied to the two gates, the electric field may reach $F_s$ either at $x=L_1$ or $x=L$. For example, considering the case, when $V_{t1}=V_{t2}$ but $V_{g2}$ is greater than $V_{g1}$ ($V_{g2}-V_{g1}=\Delta V_g=$a constant). In this case, when $V_{g1}$ is close to $V_t$ the electric current is limited by the section of channel 60 under the first gate. Hence, the voltage drop, $V_1$, across the section of the channel increases until the saturation is reached at the end of the section of the channel under the first gate ($x=L_1$). At large gate voltage swings, the velocity saturation occurs at the drain side of the channel ($x=L$). In this case, the drain saturation current, $I_s$, and potential $V_1$ are found from the solution of the following equations, obtained by the integration described above:

$$I_s=(\mu c_{eff}W/L_1)(V_{gt1}V_1-V_1^2/2) \quad \text{Equation 7}$$

$$I_s(L-L_1)=\mu c_{eff}W\{V_{gt2}[V_{gt2}-I_s/(\mu c_{eff}F_sW)-V_1]-V_{gt2}-I_s/(c_{eff}F_sW)]^2/2+V_1^2/2\} \quad \text{Equation 8}$$

Here $V_{gt2}=V_{g2}-V_{t2}$, $V_{gt1}=V_{g1}-V_{t1}$, $V_1=V(L_1)$. Once these equations are solved, the device transconductance in the saturation regime is calculated as $g_m=dI_s/dV_{g1}$ (taking into account that $V_{g2}=V_{g1}+\Delta V_g$).

Figure 4:
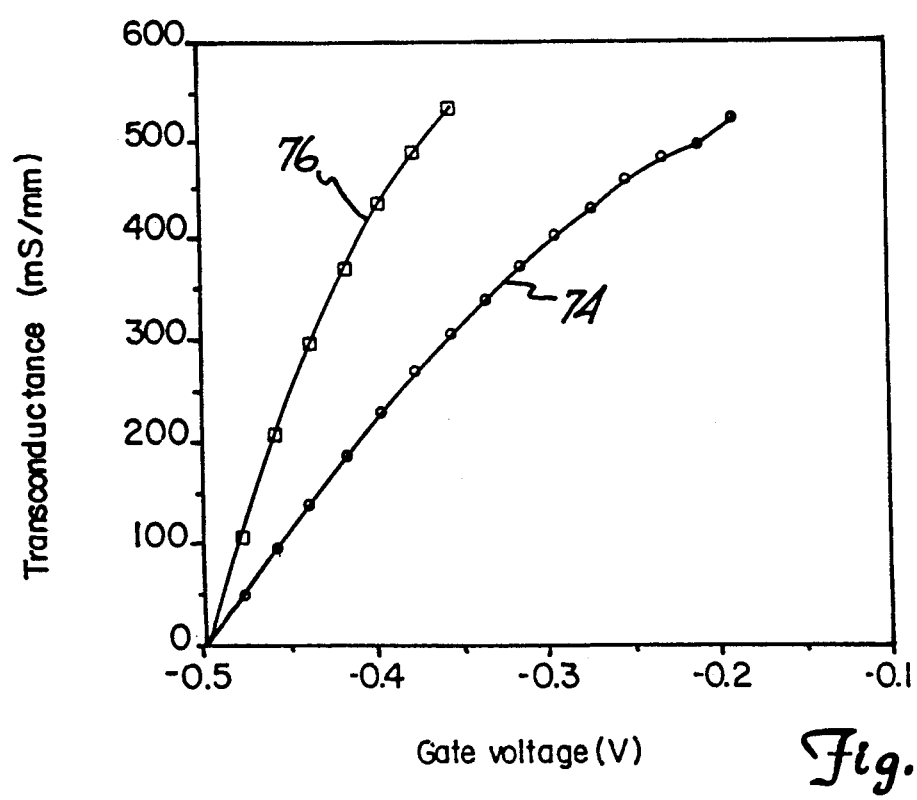
FIG. 4 is a graphical representation of the transconductance versus the gate voltage for a conventional field effect transistor and a split-gate field effect transistor.

The results of such a calculation are shown graphically in FIG. 4. Line 74 was calculated using $V_g=0$ (i.e. a conventional field effect transistor). Line 76 was calculated with $\Delta V_g=0.1$ V (i.e a split-gate field effect transistor with a 0.1 volt difference between the two gates). As seen in FIG. 4, in split-gate operation shown by line 76, the maximum transconductance is achieved at a much smaller gate voltage swing.

This simple model does not take into account an enhancement of the electron velocity due to the ballistic effects under the conditions of faster electronic acceleration in the split-gate mode of operation. This effect should increase the effective electron saturation of velocity, $v_s$, and hence, the maximum device transconductance.

Further analysis of this model reveals that the greatest benefit of the split-gate device occurs in materials with a relatively small electron mobility and a relatively large saturation velocity. Such materials include InP, diamond, SiC, and p-type materials.

The present invention considerably increases electron or hole transport speed in short channel field effect transistors by utilizing a lateral variation of the gate voltage swing. This is achieved by either making the threshold voltage a function of position or by using a split-gate gate field effect transistor. In both cases, a smaller gate voltage swing close to the source leads to a higher electric field in this portion of the channel and therefore, to a more rapid increase of the electron velocity with distance. Calculations of the device transconductance using a charge-control model show that the performance in the split-gate device can be considerably improved compared to a conventional field effect transistor. Even larger improvements may be expected because of the enhancement of the ballistic transport in short channel devices caused by the faster acceleration of electrons in a split-gate field effect transistor.

In a split gate device, further improvements may be realized by using more than a single split gate pair.

What is claimed is:

1. A method of decreasing carrier transit time in a transistor including a drain region, a single conducting channel region, a source region, and first and second gate contacts overlying the channel region, comprising the steps of:

applying an electric field to the single conducting channel region by applying voltages to the gate contacts which overlie the channel region in a single plane; and varying a vector component of the electric field in the channel region in a direction from the source region to the drain region as a function of position in the direction from the source region to the drain region by applying a first voltage to the first gate contact overlying the channel region and separated from the channel region by an insulator which has an insulator thickness and applying a second voltage to the second gate contact overlying the channel region and separated from the channel region by the insulator, wherein the first voltage is different from the second voltage and the first and second gate contacts are separated from each other by a distance generally less than the insulator thickness.

2. A field effect transistor comprising:

a drain source region including a drain contact;

a source region including a source contact;

a channel region extending between the drain region and the source region;

a plurality of gate contacts overlying the channel region in a single plane, each gate contact of the plurality of gate contacts is electrically isolated from the other gate contacts and is generally separated from the channel region by an insulating layer having an insulator thickness between a gate contact and the channel region, and wherein adjacent gate contacts of the plurality of gate contacts are separated from each other by a distance generally less than the insulator thickness between a gate contact and the channel region; and means for applying a plurality of different voltages to the plurality of gate contacts.

3. The field effect transistor of claim 2 wherein the insulating layer is AlGaAs.

* * * * *